United States Patent [19]

Kurose

[11] 4,298,848
[45] Nov. 3, 1981

[54] FEEDING DEVICE FOR PRINTED CIRCUIT BOARD AND FEEDING ELEMENT

[75] Inventor: Hideo Kurose, Zushi, Japan

[73] Assignee: Jelmax Co., Ltd., Tokyo, Japan

[21] Appl. No.: 96,913

[22] Filed: Nov. 23, 1979

[30] Foreign Application Priority Data

Dec. 22, 1978 [JP] Japan .............................. 53-159437
Dec. 22, 1978 [JP] Japan .............................. 53-159438

[51] Int. Cl.$^3$ .......................... H01P 7/01; H01P 7/48; H01G 4/32; H01G 1/147
[52] U.S. Cl. ................................. 333/181; 333/167; 333/172; 333/185; 361/306; 361/313
[58] Field of Search .............. 333/185, 181, 182, 184, 333/167, 172; 361/328-330, 303, 301-302, 304, 305, 306-313

[56] References Cited

U.S. PATENT DOCUMENTS 2,000,441  5/1935  Given .................................. 333/184

*Primary Examiner*—Marvin L. Nussbaum
*Attorney, Agent, or Firm*—Frishauf, Holtz, Goodman and Woodward

[57] ABSTRACT

A feeding device for a printed circuit board comprises a distributed capacity element comprising at least a first conductive strip and a second conductive strip separated from each other by a low loss dielectric layer, leading-out terminals coupled to the first conductive strip, a power source connected to at least one leading-out terminal of the first conductive strip, an electrolytic capacitor connected to the power source, and at least one non-polarized capacitor connected in parallel with the electrolytic capacitor, the second conductive strip being connected to a grounding circuit. A feeding element used in a feeding device comprises the distributed capacity element formed in an oblong shape by folding and coiling up the first and the second conductive strips layered as above-mentioned, and leading-out terminals connected to each of the strips, the element being enclosed in a container or encapsulated by plastic material.

12 Claims, 5 Drawing Figures

FEEDING DEVICE FOR PRINTED CIRCUIT BOARD AND FEEDING ELEMENT

BACKGROUND OF THE INVENTION

This invention relates to a feeding device for a printed circuit board useful particularly for high fidelity, low noise amplifiers etc., and also relates to a novel feeding element used therein.

A conventional printed circuit board comprises a wiring circuit of stringy-made foil which is prepared by placing a copper foil on an insulating board and etching the so laminated copper foil. Generally, the thickness of the copper foil is as thin as several tens to several hundreds micronmeters. When the thinner foil is employed for a printed circuit board, however, there occurs non-linear distortion on the printed circuit that employs the so treated foil as a line. For this reason, a printed circuit used in high-quality audio equipment comprises, for example, sufficiently thicker foil to avoid the non-linear distortion. The employment of such thicker foil, however, requires a very long time for the etching, in other words, for forming the circuit. This inevitably results in a circuit of extremely high price. There is also another principal non-linear distortion disturbing the amplifier, occurring on another portion than the above-mentioned circuit. That is a power source being connected to the circuit, and it is ascertained that the non-linear distortion occurring in an electrolytic capacitor provided to the power source particularly causes cross modulation on either of signals, resulting in lowering extremely the quality of the amplifier.

For another example, in digital signal devices such as computers, the power feeding line on the printed circuit board is supplied with deposited feeding bus bars having distributed capacities. In this case, the distributed capacity per unit length of the bus bar is as low as 500 PF/100 mm. at the maximum. This means that enough by-pass function can not be achieved when such system is employed in the audio band. In addition, since this system utilizes such material of high dielectric constant as film of plastic material, ceramic material, etc., as the dielectric material providing the distributed capacity, the non-linear distortion of the line increases due to the dissipation factor of the material and enhances the equivalent series resistance to enlarge the internal loss. These phenomena result in an increase of the distortion among the circuits utilizing the common power line. Therefore, such bus bar cannot be employed in high-quality audio equipment.

This invention, accordingly, provides a feeding device for a printed circuit board useful particularly for such low-noise electric equipment as high quality audio and video equipment, and a feeding element used therein, both of which comprises providing an improved feeding means to a portion constituting a common power line in plural circuits on a printed circuit board and also providing a novel feeding element of large capacity and low loss pertinent to the feeding means, thereby decreasing as far as possible the non-linear distortion occurring in the power source.

It is a principal object of this invention to provide a feeding device and a feeding element that are able to minimize the non-linear distortion occurring on a power line in an electrical device utilizing a printed circuit board.

It is another object of this invention to decrease cross modulation occurring among the circuits using a common line in an electrical device utilizing a printed circuit board, by constituting the power line on the printed circuit board with distributed capacity elements of low loss.

It is still another object of this invention to provide a feeding element of low loss and large distributed capacity that is able to minimize the distortion occurring among the circuits using a common power line in an electrical device utilizing a printed circuit board.

SUMMARY OF THE INVENTION

According to this invention, there is provided a feeding device for a printed circuit board which comprises a distributed capacity element having a plural number of layers comprising a first conductive strip and a second conductive strip separated from each other by a low loss dielectric layer, a plural number of leading-out terminals coupled to the first conductive strip of the distributed capacity element, at least one leading-out terminal coupled to the second conductive strip of the distributed capacity element, a power source connected to at least one leading-out terminal of said terminals coupled to said first conductive strip, an electrolytic capacitor connected to the power source, and at least one non-polarized capacitor having a dissipation factor intermediate between that of said distributed capacity element and that of said electrolytic capacitor and being connected in parallel with the electrolytic capacitor, said second conductive strip of the distributed capacity element being connected to a grounding circuit.

There is also provided a feeding element for a printed circuit board which comprises a distributed capacity element so formed in a substantially oblong shape by folding and coiling up a plural number of layers comprising at least of a first conductive strip placed on a dielectric layer and a second conductive strip placed on another dielectric layer each laminated alternately such that the first conductive strip and the second conductive strip are separated from each other by the respective dielectric layers and that the length in the longitudinal direction of the distributed capacity element is sufficiently greater than the width of the conductive strips, a plural number of terminals led out of one side of the distributed capacity element at appropriate intervals and connected to each of the strips, means for connecting in common each pair of the terminals which belong to the same strip and which are located adjacent to each other among said terminals, and a container for enclosing the distributed capacity element.

BRIEF DESCRIPTION OF THE DRAWINGS

FIGS. 2A and 2B, illustrate a main portion of a feeding element used in a feeding device of this invention, in which FIG. 2A is a perspective view, and FIG. 2B is a cross-sectional view taken along the line X—X in FIG. 2A and slightly enlarged in thickness;

DETAILED DESCRIPTION

Figure 1:
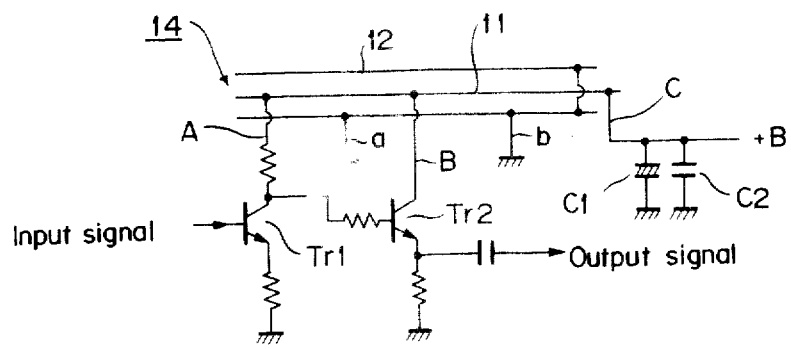
FIG. 1 is a circuit diagram showing a feeding device embodying this invention.

In FIG. 1, numerals 11 and 12 respectively designate first and second strips, having high electro-conductivity, made of copper foil or the like. The first and second strips, 11 and 12, are separated from each other by a dielectric layer having a dissipation factor of not more than 0.1% at 100 KHz, and made of dielectric material such as polystyrene resin, fluororesin and polypropylene resin, and a plural number of the so layered first and second strips is folded and coiled up to form a distributed capacity element 14 of the laminated layers having an electrostatic capacity of not less than 5000 PF/100 mm in length.

On the first strip 11 of the distributed capacity element 14 are provided a plural number of leading-out terminals A, B and C, and the terminals A and B are, for instance, connected to collector terminals of the transistors $Tr_1$ and $Tr_2$ constituting an audio amplifier circuit to serve as feeding terminals for the same. The leading-out terminal C is connected to a power source circuit (not shown) to supply +B power. To the terminal C is connected an electrolytic capacitor $C_1$ having relatively large capacity to smooth the power current and to serve as a common path for signals.

An electrolytic capacitor $C_1$ is, generally, non-linear to the signal frequency and, particularly in the high audible frequency band to which the audio signal belongs, the internal loss causing the non-linearity is so great as to provide distortion to the supplied audio signal, resulting in causing cross modulation and very much disturbing the fidelity of the regenerative audio signal. For settling such problems residing in the sole use of the electrolytic capacitor $C_1$, the aforementioned low loss distributed capacity element 14 of this invention utilizes a dielectric layer of the above-mentioned material and is a laminated one comprising a number of conductive strips and having such relatively great capacity as not less than 5000 PF/100 mm in length, and therefore the element 14 has extremely low internal loss in the range up to such frequency band as higher than the high signal frequency area in the audible frequency band, and a low non-linear characteristic to inhibit the occurrence of the distortion. Accordingly, the distortion in the high frequency band decreases.

As for the distortion in the middle audio frequency band, if a non-polarized capacitor $C_2$ of polyester film, paper or polycarbonate film, having such large capacity as 1 to 10 μF., though its dissipation factor is slightly larger than that of the dielectric layer of the distributed capacity element 14, and smaller than that of the electrolytic capacitor $C_1$ is connected in parallel and selected so as to improve the non-linear characteristic caused in the middle frequency band by the aforementioned electrolytic capacitor $C_1$ and to reduce almost continuously the loss from a low frequency area towards a high frequency area of the whole audible frequency band, the cross modulation distortion occurring in the power source and the common line can be avoided very efficiently and the regeneration is carried out very effectively with high fidelity throughout the audio signal band.

Moreover, since the capacitors $C_1$ and $C_2$, both connected to the feeding terminal C, and the leading-out terminals A and B are also connected to the distributed capacity element having the conductive strip 11, the E.S.R. (Equivalent Series Resistance) of each of the capacitors $C_1$ and $C_2$ viewed from each leading-out terminal of the line towards the power source is prominently smaller than the E.S.R. of the capacitors viewed from a narrowly formed feeding point towards the concentratedly constituted power source in a conventional printed circuit board. For this reason, the internal loss of the power source of each circuit is prominently reduced, and undesirable influences on the amplifying signal caused by the loss present in the power source side is also reduced to provide the high fidelity regeneration.

In addition, other capacitors than the capacitor $C_2$, such as those having different loss and capacity may be provided in the system.

If a plural number of leading-out terminals a and b are optionally provided to the second strip 12 of the aforementioned distributed capacity element 14 and then the terminals a and b are grounded, the resulting effect is better than that obtained when only a single terminal is grounded.

Figure 2A:
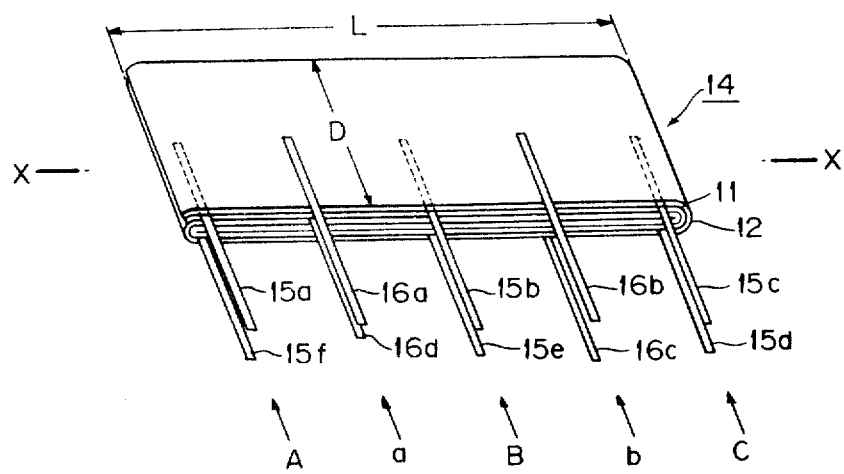
Figure 2B:
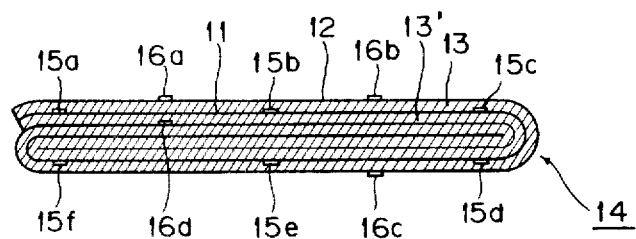

FIG. 2 shows the structure of a feeding element according to this invention. The first conductive strip 11 of narrow shaped copper foil having a thickness of 5 to 30 μm, a dielectric layer of a low loss film 13 made of polystyrene resin, fluororesin, polypropylene resin or the like and having a dissipation factor of not more than 0.1% at 100 KHz and a thickness of 6 to 20 μm, the second conductive strip 12 having the same property as in the strip 11, another dielectric layer of a low loss film 13' having the same characteristics as the layer 13 are alternately laminated in this order, and a plural number of the so layered strips is folded and coiled up to form a distributed capacity element 14 having an electrostatic capacity between the first and second not less than 5000 PF/100 mm in length. The distributed capacity element 14 is so folded and coiled up that the first conductive strip 11 and the second conductive strip 12 are separated from each other by the respective dielectric layers 13 and 13', and that the element 14 is in a substantially oblong shape whose longer side has the length L sufficiently greater than the width D (shorter side) of the strips 11 and 12 as shown in FIG. 2A. The length L, more particularly, should preferably be about 3 to 10 times greater than the width D.

If necessary, to the so layered strips as mentioned above may be further laminated and coiled up together, a third conductive strip, a fourth conductive strip and so on, each having the same dielectric layer as mentioned above.

On each of the strips 11 and 12 are provided a plural number of terminals 15a, 15b, --- and 16a, 16b ---, respectively, at appropriate intervals, along the longitudinal direction thereof and led outwardly in the direction substantially perpendicular to one side line of the aforementioned coiled distributed capacity element 14.

Each pair of the leading-out terminals of either the first or second strips 11 or 12, are located adjacent to each other, namely, each pair of the terminals 15a and 15f, terminals 15b and 15e, terminals 15c and 15d, terminals 16a and 16d, and terminals 16b and 16c are connected in common. This means that the strips 11 and 12 are connected, along the longitudinal directions, through the so formed short circuit, and that the leading-out terminals A, B and C and the leading-out terminals a and b are provided corresponding to the first strip 11 and the second strip 12, respectively.

In this case, as shown in FIG. 2, the terminals 15a, 15b, ---, 16a, 16b, --- can be in the form of foil and fixed to the strips 11 and 12, and then the strips with the fixed terminals are coiled up. Alternatively, the terminals can be formed integrally in such a manner that the terminals protrude from the sides of the strips 11 and 12.

Figure 3:
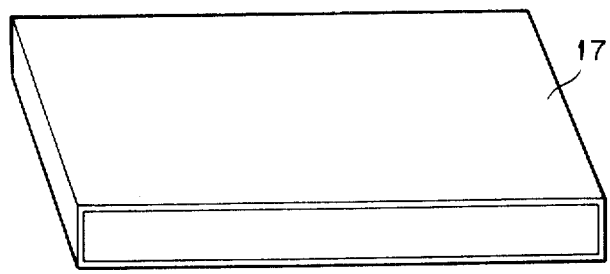
FIG. 3 is a perspective view showing a container forming a shell of a feeding element of this invention.

The distributed capacity element 14 thus formed in the flat shape can be placed within a container 17 made of plastic material, as shown in FIG. 3, and fixed therein with an appropriate filler. Alternatively, the element 14 can be simply enveloped in a protective film such as a film of plastic material or rubber.

Figure 4:
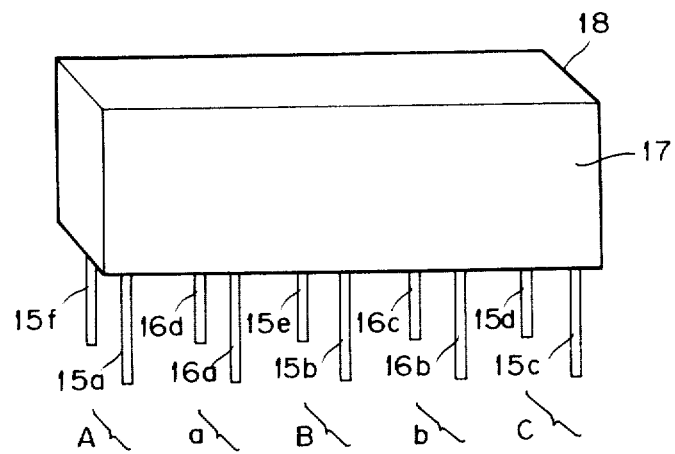
FIG. 4 is a perspective view showing a completed feeding element.

FIG. 4 is a perspective view showing the completed feeding element 18 for a printed circuit board. In FIG. 4, the terminals 15a, 15b, ---, 16a, 16b, ---, are illustrated in such a manner that the terminals are led out separately and independently. In another embodiment, the terminals can be connected therebetween within the container 17 and fixed and protected in the container with a filler, as described hereinbefore. If the element as illustrated in FIG. 4 is employed for a printed circuit board, the terminals are jointly connected to the circuit elements in an appropriate way. In the embodiment as shown in FIG. 4, the container 17 is separately and independently prepared for the application. In an alternative example, if the distributed capacity element 14 is immersed in melted plastic material to become coated and encapsulated therein, the encapsulation thus prepared can serve as the container 17 to protect and fix effectively the leading-out terminals with solidified plastic material.

Since the leading-out terminals a and b of the distributed capacity element 14 are grounded as shown in FIG. 1, the common power source for each of circuits of the transistors $Tr_1$ and $Tr_2$ has low loss and is solidly grounded due to the distributed electrostatic capacity formed between the strips 11 and 12. Accordingly, the circuit can work stably with only an extremely low level of distortion. Moreover, coupling between the circuits cannot occur. In this case, if the coiled first and second strips 11 and 12 on the outer side viewed in the coiled state are made to form the grounding circuits and the strips on the inner side are used for a power source, the power source is effectively shielded from other circuits.

The incorporation of one feeding element 18 cannot be expected to satisfy a number of the transistor elements, because the feeding element 18 inevitably carries only a limited number of leading-out terminals for feeding. Thus, a plural number of the feeding elements 18 can be employed in accordance with the number of the feeding terminals. The leading-out terminals for feeding (the leading-out terminals for positive polarity voltage in the example) of each feeding element 18 can be directly connected to those terminals of other feeding elements with lead-in wires. Otherwise, those terminals are connected to each other in a cascade connection, employing appropriate resistance on the connecting wires. Further, capacitors corresponding to the capacitors $C_1$ and $C_2$ are, if necessary, connected to the feeding elements 18. By setting out the elements and parts in the above manner, the feeding can be effectively done to a whole system of the circuits and the high-fidelity amplifier works more excellently.

Since each of the first and second strips constituting the feeding element carries a plural number of the terminals led out therefrom and the terminals form the short circuits, as described hereinbefore, there occurs no resonance at a certain frequency band, which is liable to be caused by the distributed capacity of the feeding element and the inductance occurring due to the coiled strips and thus the circuits cannot become unstable. Moreover, since the resonance of the capacitors $C_1$ and $C_2$ connected in parallel is effectively suppressed by the feeding element based on the above-stated reason, the whole feeding system works very stably. Resonances never occur throughout a wide frequency band and the system works more stably than a power source system in which a plural number of capacitors are provided in a concentrated manner to an electrolytic capacitor.

Accordingly, this invention provides a feeding device and a feeding element which may be readily fitted to the conventional printed circuit, with no considerable change of the structure of the circuit, that is incorporated in a feeding device for equipment which handles weak analog signals, for example, an audio amplifier, video equipment, etc.

I claim:

1. A power feeding device for a printed circuit board comprising a distributed capacity element of a plural number of layers comprising:
   a first conductive strip and a second conductive strip separated from each other by a low loss dielectric layer,
   a plural number of leading-out terminals coupled to the first conductive strip of the distributed capacity element,
   at least one leading-out terminal coupled to the second conductive strip of the distributed capacity element,
   a power source connected to at least one leading-out terminal of said leading-out terminals of said first conductive strip,
   an electrolytic capacitor connected to the power source, and
   at least one non-polarized capacitor having a dissipation factor which is intermediate between that of said distributed capacity element and that of said electrolytic capacitor and being connected in parallel with the electrolytic capacitor,
   said second conductive strip of the distributed capacity element being connected to a grounding circuit.

2. A power feeding device for a printed circuit board as claimed in claim 1, in which the material of the low loss dielectric layer is selected from the group consisting of polystyrene resin, fluororesin and polypropylene resin and the electrostatic capacity of the distributed capacity element is not less than 5000 PF/100 mm in length.

3. A power feeding device for a printed circuit board as claimed in claim 1, in which the non-polarized capacitor is made of polyester film, paper or polycarbonate film.

4. A power feeding element for a printed circuit board comprising:
   a distributed capacity element formed in a substantially oblong shape and having a plural number of layers which include at least a first conductive strip placed on a dielectric layer and a second conductive strip placed on another dielectric layer, each layer being laminated alternately such that the first conductive strip and the second conductive strip are separated from each other by the respective dielectric layers, said layers being folded and coiled to produce said substantially oblong shape wherein the length in the longitudinal direction of the distributed capacity element is substantially greater than the width of the conductive strips,
   a plural number of terminals led out of one side of the distributed capacity element at appropriate intervals and connected to each of the conductive strips, means for connecting in common each pair of the terminals which belongs to the same strip and which are located adjacent to each other among said terminals, the common connection being interior of the power feeding element, and a container for enclosing the distributed capacity element.

5. A power feeding element for a printed circuit board as claimed in claim 4, in which outer sides of the coiled first and second strips are grounded and inner sides thereof are employed for power feeding.

6. A power feeding element for a printed circuit board as claimed in claim 4, in which the material of the low loss dielectric layer has a dissipation factor of not more than 0.1% at 100 KHz.

7. A power feeding element for a printed circuit board as claimed in claim 4, in which the material of the dielectric layer is selected from the group consisting of polystyrene resin, fluororesin and polypropylene resin, and the electrostatic capacity of one of the distributed capacity element is not less than 5000 PF/100 mm in length.

8. A power feeding element for a printed circuit board as claimed in claim 4, in which a plural number of the leading-out terminals are connected together in cascade connection.

9. A power feeding element for a printed circuit board as claimed in claim 4, in which the container is formed by immersing the distributed capacity element in melted plastic material.

10. A power feeding element for a printed circuit board as claimed in claim 4, in which the length of the distributed capacity element prepared by folding and coiling the first and second strips up is about 3 to 10 times greater than the width of the strips.

11. A power feeding element for a printed circuit board as claimed in claim 8, in which said cascade connected leading-out terminals are connected together in a direct cascade connection.

12. A power feeding element for a printed circuit board as claimed in claim 8, in which said cascade connected leading-out terminals are connected together via a resistance.

* * * * *